Aug. 13, 1968 L. T. FINE ETAL 3,397,324
PEAK AMPLITUDE TO R.M.S.LIMITER
Filed April 14, 1965
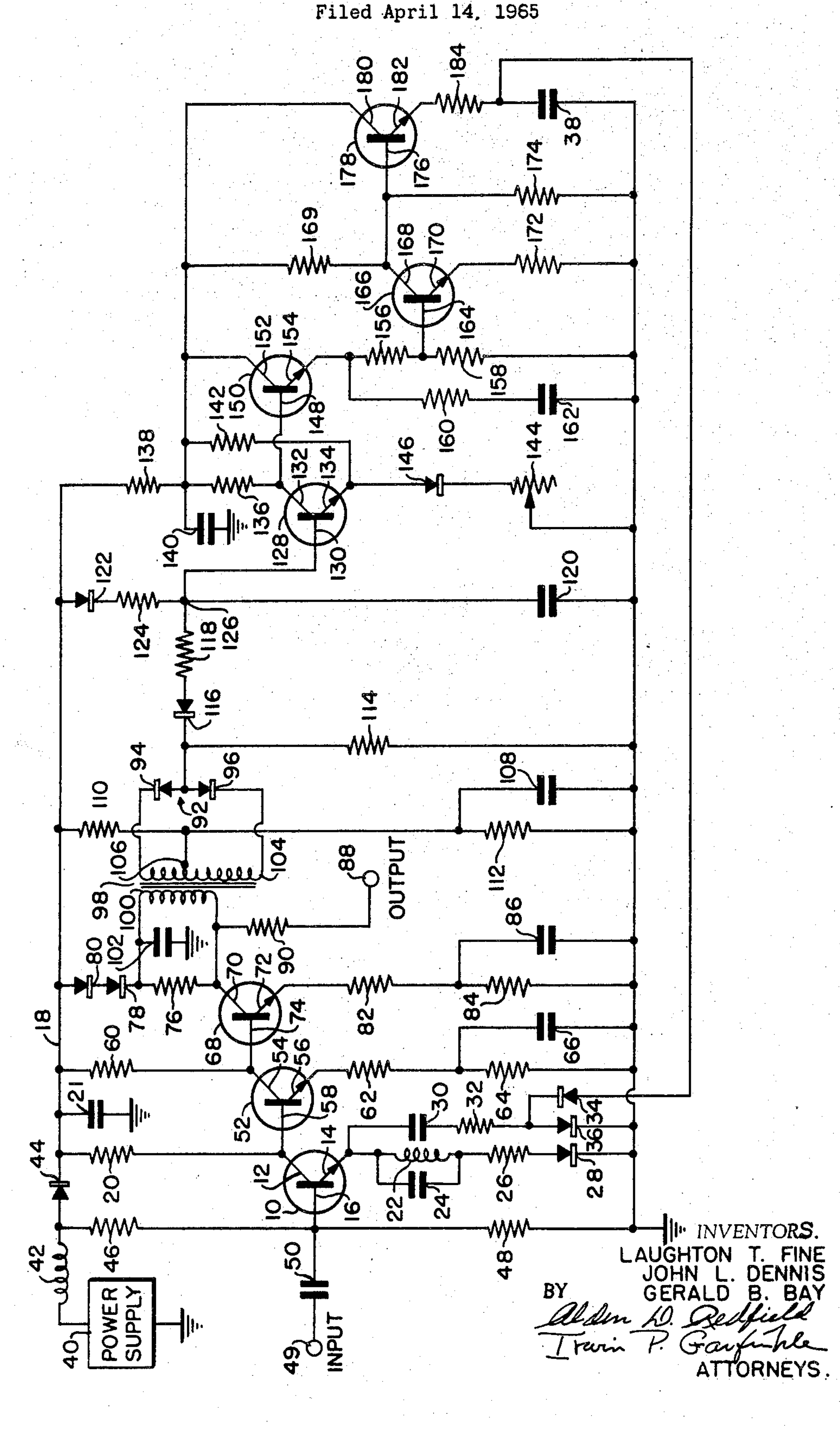
INVENTORS.
LAUGHTON T. FINE
JOHN L. DENNIS
GERALD B. BAY
BY Alden D. Redfield
Irwin P. Garfinkle
ATTORNEYS.

United States Patent Office 3,397,324

Patented Aug. 13, 1968

3,397,324

PEAK AMPLITUDE TO R.M.S. LIMITER

Laughton T. Fine, Cincinnati, Ohio, John L. Dennis, Lexington, Ky., and Gerald B. Bay, Cincinnati, Ohio, assignors to Avco Corporation, Cincinnati, Ohio, a corporation of Delaware Filed Apr. 14, 1965, Ser. No. 448,178
12 Claims. (Cl. 307—237)

ABSTRACT OF THE DISCLOSURE

An I.F. amplifier is provided with a variable impedance device in its first stage. The second and third stages of the I.F. amplifier include saturable transistor amplifiers arranged for negative and positive signal limiting at a preset level above a desired R.M.S. level. A portion of the output derived from the amplifier is full wave rectified to derive a pulsating direct voltage which is then applied to a piece-wise square law detector. The output of the square law detector after amplification is used to control the variable impedance in the first stage amplifier to maintain a constant signal R.M.S. value and a fixed ratio between the signal R.M.S. value and the level of the signal limiting.

This invention relates to electronic circuitry useful in communications equipments, and more particularly to a circuit for maintaining relatively constant the preset ratio between maximum signal level and the R.M.S. value of the signal.

In many communications transmission systems it is desirable to dissipate unwanted peak energy from the signal transmissions. This is accomplished in the prior art by limiting or clipping; however, the usual prior art signal limiter does not satisfactorily maintain a fixed relation between the maximum signal level and the R.M.S. value of the signal, but allows the clipped level to vary with signal variations. Accurate clipping referenced to the R.M.S. level is often necessary as in low level intermediate frequency stages of a single sideband generating system. Speech and modulation peaks, normally detrimental to system performance, can be reduced to a fixed level, permitting more efficient operation of a peak power limited transmitter.

It is therefore an object of this invention to provide a signal translating circuit including the function of signal limiting wherein the ratio of maximum signal level with respect to signal R.M.S. is maintained relatively constant.

Another object of this invention is to control the maximum signal level of an electronic translating circuit by means of an R.M.S. derived automatic gain control loop.

Another object of this invention is to provide circuitry for maintaining a relatively constant R.M.S. signal level by means of a servo loop gain control to maintain a substantially fixed ratio between a preset clipped signal level and said R.M.S. signal level.

Another object of this invention is to provide a limiter comprised of a saturable amplifier gain controlled by means of an R.M.S. derived automatic gain control loop.

Still another object of this invention is to provide an amplifier having a saturation level set for firm signal clipping at a given level, and to vary the gain of said amplifier with an automatic gain control voltage which is a function of the R.M.S. of the signal level.

Another object of this invention is to provide an amplifier biased to saturate at a given level above a desired R.M.S. signal level to produce signal clipping above said given level; to provide means for deriving an automatic gain control voltage proportional to the instantaneous R.M.S. signal level; and to control the gain of said amplifier with said automatic gain control voltage to maintain the relation between said given level and the signal R.M.S. level relatively constant.

Briefly described, this invention includes a first stage transistor amplifier to which signal modulated intermediate frequencies are applied. A variable impedance in the emitter circuit of this stage is varied in accordance with an ultimately derived automatic gain control voltage which is a function of the R.M.S. level of the signal.

The first amplifier stage is followed by two saturable transistor amplifier stages arranged, respectively, for negative and positive signal limiting at a preset level above a desired signal R.M.S. value. The amplified, signal-modulated intermediate frequency is then derived from the output of the second saturable amplifier. This amplified signal should have a relatively constant R.M.S. level in spite of signal level variations at the input of the first stage.

This result is accomplished by feeding a portion of the intermediate frequency output to a full-wave rectifier and then applying the derived pulsating direct voltage to a piece-wise square law detector. The output of the detector provides a direct voltage automatic gain control signal which is proportional to the instantaneous R.M.S. value of the applied signal. After several stages of direct current amplification, the automatic gain control voltage is used to control the variable impedance in the emitter of the first stage transistor to control the gain thereof. Thus a constant signal R.M.S. value is maintained, and a fixed ratio between signal R.M.S. value and the level of signal limiting results.

For a better understanding, and for further objects and advantages of this invention, reference should now be made to the accompanying drawing in which the single figure illustrates a preferred embodiment which found utility in a single sideband communications system.

In the drawing, the first stage amplifier includes a transistor 10 having a collector 12, an emitter 14, and a base 16. The collector 12 is connected to a direct current supply line 18 through a collector load-resistor 20 with the supply line being connected to ground for alternating currents through a capacitor 21. The emitter 14 is connected to ground through two parallel paths, one including a parallel-connected inductor 22 and capacitor 24, resistor 26, and a temperature-compensating diode 28. The other path includes a capacitor 30, a low impedance resistor 32, two diodes 34, 36, and a capacitor 38.

Direct voltage operating bias for the transistor 10 is supplied from a direct current power supply 40 to the line 18 through a choke 42 and a temperature-compensating diode 44. Base bias is provided by means of voltage-dividing resistors 46 and 48 connected between the junction of the choke 42 and diode 44 and ground.

Signal-modulated intermediate frequencies are applied from input terminal 49 to the base 16 through a coupling capacitor 50. Amplified output signals are derived from the collector 12 and are applied to a limiter which includes two cascaded saturable amplifiers.

The first saturable amplifier comprises a transistor 52 having a collector 54, an emitter 56, and a base 58. The collector 54 is connected to supply line 18 through a load-resistor 60, while the emitter 56 is connected to ground through an emitter-resistor 62 and an emitter-resistor 64 shunted for alternating currents by a capacitor 66. The output of the first stage transistor 10 is coupled directly to the base 58, while the amplified output from transistor 52, with the negative peaks clipped, is derived from the collector 54. Clipping occurs by limiting the available negative excursion of the collector voltage with the biasing.

A transistor 68, having a collector 70, an emitter 72, and a base 74, is used for further amplification and for clipping of the opposite peaks, which also appear as negative peaks due to signal inversion. Collector 70 is connected to supply line 18 through a load-resistor 76 and through two series-connected forward biased diodes 78 and 80. These diodes are for temperature compensation and in practice are comprised of one double junction component. The emitter is connected to ground through emitter-resistors 82 and 84, resistor 84 being shunted for alternating currents by capacitor 86. The output of transistor 52 is directly coupled from the collector 54 to the base 74 of transistor 68, and the output from transistor 68 is derived at terminal 88 from the collector 70 through a resistor 90.

The output at terminal 88 should have a relatively constant R.M.S. To accomplish this, a portion of the clipped signal at collector 70 of transistor 68 is applied to a full-wave rectifier 92 consisting of diodes 94 and 96 through a transformer 98 having a primary winding 100 connected between collector 70 and ground through a capacitor 102. The secondary winding 104 is center tapped at point 106 which is connected to ground for alternating current through a capacitor 108. The diodes 94 and 96, which are series-connected back to back across secondary winding 104, are back biased by means of voltage-divider resistors 110 and 112 connected between supply line 18 and ground, the junction of the resistors 110 and 112 being connected to point 106.

The full wave rectified, clipped output of rectifier 92 is applied to a load resistor 114 and to a piece-wise square law detector consisting of a diode 116, a resistor 118, and a capacitor 120 connected in series across resistor 114. The diode 116 is slightly forward biased by means of a connection from the supply line 18 through a diode 122 and a resistor 124 connected to the junction 126 of resistor 118 and capacitor 120.

The output of the square law detector is then applied to several stages of direct current amplification, the first of which includes a transistor 128 having a base 130 connected to the junction 126, a collector 132 and an emitter 134. Collector 132 is connected to the supply line 18 through a collector load-resistor 136 and a resistor 138, the load-resistor 136 being returned to ground for alternating currents through a capacitor 140. Bias for the emitter 134 is provided by means of a connection to a voltage-divider including a resistor 142, a potentiometer 144, and a diode 146 used for temperature compensation.

The output of transistor 128 is applied directly to the base 148 of transistor 150, its collector 152 being connected to supply line 18 through the resistor 138, and its emitter 154 being connected to ground through its emitter-follower load including resistors 156 and 158, shunted by resistor 160 and capacitor 162, which provide a fast attack-slow decay circuit.

The emitter-follower output of transistor 150 is derived from the junction of resistors 156 and 158 and applied to the base 164 of transistor 166. Collector 168 of transistor 166 is connected to the supply line 18 through a load-resistor 169 and resistor 138, while its emitter 170 is connected to ground through resistor 172. The direct voltage output derived from the collector 168 is applied across a resistor 174 and to the base 176 of transistor 178. The collector 180 of transistor 178 is connected to the supply line 18 through resistor 138, while its emitter 182 is connected to ground through an emitter-follower load-resistor 184 and through the diodes 34 and 36 which are also in the alternating current emitter load of the first stage transistor 10.

In operation, intermediate frequencies modulated with signal are applied to the input terminals where the signals are amplified in the transistor 10 and clipped of their peaks. Each transistor clips the negative peak at its own collector, but because of the phase reversal between transistors, the negative and positive peaks are effectively clipped in the transistors 52 and 68, respectively. The emitter circuit of the transistor 10 is provided with one emitter load having a relatively fixed impedance which is shunted by a variable impedance load comprised of the diodes 34 and 36. The object of the circuitry is to vary the impedance of the diodes 34 and 36 so as to maintain an essentially constant R.M.S. signal level at the output terminal 88 of the amplifier and limiter. To accomplish this, the amplified and limited signals applied to the transformer 98 are full wave rectified by means of the diodes 94 and 96. Thereafter the full wave rectified signals are applied to the piece-wise square law detector comprising the diode 116, resistor 118, and capacitor 120. The direct voltage thus produced across the capacitor 120 at the junction 126 is proportional to the average R.M.S. value of the applied signal.

This direct voltage is then amplified through several stages 128, 150, 166, and 178, the last of which includes variable impedance diodes 34 and 36 which are in the emitter circuit of transistor 10. The application of a large signal to the base 176 results in a large current flow through the diodes 34 and 36, thereby reducing the impedance of the diodes 34 and 36 and hence effectively connecting the emitter 14 of transistor 10 closer to ground. A reduced voltage signal applied to the base 176 of transistor 178 results in an increase in the impedance in the emitter circuit of transistor 10, thereby decreasing the gain of that transistor, but the increase and decrease in either case will be proportional to the R.M.S. of the signal. The stages are arranged so that an increase in signal voltage at output terminal 88 results in decreased conductivity through the diodes 34 and 36, and vice versa, thus producing a relatively constant R.M.S. level at the output terminal 88.

The following parameters actually used in an embodiment of the invention which was reduced to practice are set forth for the purpose of better enabling persons skilled in the art to reproduce this invention. It is to be understood, however, that these parameters are exemplary only, and not intended as limiting on the scope of this invention.

| | | |
|---|---|---|
| Transistors | | all type 118N2 |
| Capacitors: | | |
| 21 | μf | 3.3 |
| 24 | μμf | 110 |
| 30 | μf | 0.1 |
| 38 | μf | .022 |
| 50 | μf | .01 |
| 66 | μf | 0.1 |
| 86 | μf | 0.1 |
| 102 | μf | 0.1 |
| 108 | μf | 0.1 |
| 120 | μf | 5.6 |
| 140 | μf | 3.3 |
| 162 | μf | 33 |

| Component | | Value |
|---|---|---|
| Resistors: | | |
| 20 | ohms | 1.8K |
| 26 | do | 3.6K |
| 32 | do | 470 |
| 46 | do | 68K |
| 48 | do | 68K |
| 60 | do | 3.3K |
| 62 | do | 270 |
| 64 | do | 13K |
| 76 | do | 1.3K |
| 82 | do | 270 |
| 84 | do | 6.2K |
| 90 | do | 1.3K |
| 110 | do | 39K |
| 112 | do | 3.8K |
| 114 | do | 68K |
| 118 | do | 6.2K |
| 124 | do | 220K |
| 136 | do | 10K |
| 138 | do | 470 |
| 142 | do | 10K |
| 156 | do | 100K |
| 158 | do | 100K |
| 160 | do | 1.5K |
| 169 | do | 47K |
| 172 | do | 1.0K |
| 174 | do | 47K |
| 184 | do | 5.6K |
| Inductor 22 | μh | 470 |
| Diodes: | | |
| 28 | | type AM620A |
| 34 | | type AM620A |
| 36 | | type AM620A |
| 44 | | type AM620A |
| 78 | | type CODI 6042 |
| 80 | | type CODI 6042 |
| 94 | | type AM620A |
| 96 | | type AM620A |
| 116 | | type AM620A |
| 122 | | type CODI 6042 |
| 146 | | type 1N270 |
| Choke 42 | μh | 1000 |
| Potentiometer 144 | ohm | 1K |

Many variations and modifications of this invention will be readily apparent to persons skilled in the art. It is intended, therefore, that this invention be limited only by the scope of appended claims as read in the light of the prior art.

What is claimed is:

1. The combination comprising:
- an electronic circuit including a variable gain amplifier for amplifying signal-modulated radio frequencies, said circuit also including peak-limiting means for limiting the maximum positive and negative peaks of said signal modulated radio frequencies at preset level;
- a rectifier supplied with amplified signal-modulated radio frequencies for rectifying a portion of amplified signal-modulated radio frequencies to produce a pulsating direct voltage;
- a square law detector for detecting said rectified signal-modulated radio frequencies to provide an amplified direct voltage which is a function of the R.M.S. of said signal; and
- means in said variable gain amplifier responsive to said amplified direct voltage for varying the gain of said amplifier as an inverse function of the magnitude of said direct voltage.

2. The invention as defined in claim 1 wherein said rectifier is a full-wave rectifier.

3. The invention as defined in claim 2 wherein said amplifier includes a variable impedance, variations of which vary the gain of said amplifier, and wherein said amplified direct voltage is coupled to said variable impedance, the impedance of which varies as a function of said direct voltage.

4. The invention as defined in claim 3 wherein said variable impedance is a semiconductor diode.

5. The invention as defined in claim 3 wherein said variable impedance comprises first and second parallel-connected oppositely poled semiconductor diodes.

6. The invention as defined in claim 4, and a direct current amplifier for said direct voltage, said direct current amplifier including a transistor having a load, said load including said semiconductor diode.

7. The invention as defined in claim 5, and a direct current amplifier for said direct voltage, said direct voltage amplifier including a transistor having a load, said load including said semiconductor diodes connected in series and poled in the same direction.

8. The invention as defined in claim 3 wherein said variable gain amplifier includes:
- a transistor having a base, an emitter, and a collector;
- a two-terminal source of direct voltage biasing potential, the first of said terminals being connected to a point of reference potential;
- a collector load connected between the second of said terminals and said collector; and
- an emitter load connected between said emitter and said point, said emitter load including said variable impedance; and
- wherein said amplified signal-modulated radio frequencies derived from one of said loads is applied to said peak-limiting means.

9. The invention as defined in claim 8 wherein said emitter load comprises an emitter-resistor connected between said emitter and said point, and wherein said variable impedance is a semiconductor diode connected across said emitter-resistor, said semiconductor diode being normally biased for relatively low impedance in the absence of signal.

10. The invention as defined in claim 8 wherein said peak-limiting means comprises second and third cascaded transistors biased for saturation upon the application of signal-modulated radio frequencies above a predetermined level.

11. The invention as defined in claim 8 wherein said peak-limiting means comprises second and third transistors, each having a base, a collector, and an emitter, and each having a collector load connected between said second terminal and its collector, and an emitter load connected between said point and its emitter, the collector of the transistor of said variable gain amplifier being connected to the base of said second transistor, and the collector of said second transistor being coupled to the base of said third transistor, said amplified signal-modulated radio frequencies being derived from across the collector load of said third transistor.

12. The invention as defined in claim 11, and a transformer having a primary winding connected across the collector load of said third transistor, and a secondary winding, said full-wave rectifier being connected across said secondary winding, the full-ware rectified output of said rectifier being applied to said square law detector, said square law detector including a semiconductor diode in series with a resistor and a capacitor and being connected across said rectifier, said direct voltage being derived from the junction of said resistor and capacitor.

References Cited

UNITED STATES PATENTS 3,163,828 12/1964 Fine ............ 330—29 XR

ARTHUR GAUSS, *Primary Examiner.*

J. ZAZWORSKY, *Assistant Examiner.*